(12) United States Patent
Kuriki et al.

(10) Patent No.: US 8,147,041 B2
(45) Date of Patent: Apr. 3, 2012

(54) PIEZOELECTRIC ELEMENT AND METHOD FOR MANUFACTURING THE SAME, LIQUID-EJECTING HEAD AND METHOD FOR MANUFACTURING THE SAME, AND LIQUID-EJECTING APPARATUS

(75) Inventors: Akira Kuriki, Suwa (JP); Koji Sumi, Suwa (JP); Tatsuo Sawasaki, Suwa (JP); Tatsuro Torimoto, Suwa (JP); Motoki Takabe, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 329 days.

(21) Appl. No.: 12/611,823

(22) Filed: Nov. 3, 2009

(65) Prior Publication Data
US 2010/0110148 A1 May 6, 2010

(30) Foreign Application Priority Data

Nov. 4, 2008 (JP) ................................. 2008-283372
Sep. 16, 2009 (JP) ................................. 2009-214140

(51) Int. Cl.
*B41J 2/045* (2006.01)
*H01L 41/00* (2006.01)
*H02N 2/00* (2006.01)

(52) U.S. Cl. ...................... 347/71; 310/358; 252/62.9 R; 252/62.9 PZ

(58) Field of Classification Search .............. 347/68–72; 29/25.35; 310/358; 252/62.9 R, 62.9 PZ
See application file for complete search history.

(56) References Cited

U.S. PATENT DOCUMENTS

2006/0230590 A1 10/2006 Kuriki et al.
2011/0101828 A1* 5/2011 Noda et al. .................... 310/348

FOREIGN PATENT DOCUMENTS

JP 2006-306709 A 11/2006

* cited by examiner

*Primary Examiner* — Matthew Luu
*Assistant Examiner* — Lisa M Solomon
(74) *Attorney, Agent, or Firm* — Kilpatrick Townsend & Stockton LLP

(57) ABSTRACT

A piezoelectric element includes a piezoelectric film containing lead (Pb), zirconium (Zr), and titanium (Ti). The piezoelectric film has a composition satisfying the relationship of $Zr/(Ti+Zr) > Ti/(Ti+Zr)$ and has a polarization-electric field hysteresis loop having a Pm/2Pr of 1.95 or more and a Vc(−) of −1.75 V or more, wherein Pm denotes saturation polarization, Pr denotes remanent polarization, and Vc(−) denotes a negative coercive electric field intensity.

5 Claims, 8 Drawing Sheets

FIG. 7

| COOLANT GAS | POSITION ON WAFER | Pm (μC/cm²) | 2Pr (μC/cm²) | Vc(-) (V) | Pm/2Pr | DEFORMATION REDUCTION RATE (%) |
|---|---|---|---|---|---|---|
| $N_2$ | OPPOSITE SIDE TO OF | 33.14 | 14.29 | -1.58 | 2.32 | 8-9 |
| $N_2$ | OF | 33.54 | 17.22 | -1.75 | 1.95 | 11-13 |
| $O_2$ | ENTIRE SURFACE | 33.95 | 22.06 | -2.04 | 1.53 | 14-16 |

PIEZOELECTRIC ELEMENT AND METHOD FOR MANUFACTURING THE SAME, LIQUID-EJECTING HEAD AND METHOD FOR MANUFACTURING THE SAME, AND LIQUID-EJECTING APPARATUS

This application claims priority to Japanese Patent Applications Nos. 2008-283372, filed Nov. 4, 2008 and 2009-214140, filed Sep. 16, 2009 the entireties of which are incorporated by reference herein.

BACKGROUND

1. Technical Field

The present invention relates to a piezoelectric element for use as a liquid-ejecting head drive, such as an ink jet print head drive, and a method for manufacturing the piezoelectric element, a liquid-ejecting head and a method for manufacturing the liquid-ejecting head, and a liquid-ejecting apparatus. More particularly, the invention relates to a piezoelectric element that deforms as much as possible during startup and exhibits a small time-dependent decrease in deformation, and a method for manufacturing the piezoelectric element, a liquid-ejecting head and a method for manufacturing the liquid-ejecting head, and a liquid-ejecting apparatus.

2. Related Art

Liquid-ejecting apparatuses include a liquid-ejecting head and eject various liquids from the liquid-ejecting head. Representative liquid-ejecting apparatuses include image recorders, such as ink jet printers. Ink jet printers include an ink jet print head (hereinafter referred to simply as a print head) as a liquid-ejecting head and eject liquid ink from nozzle openings of the print head onto a recording medium (an ejection target), such as recording paper, to print images composed of dots. In recent years, in addition to the image recorders, liquid-ejecting apparatuses have been applied to various manufacturing apparatuses, such as apparatuses for manufacturing color filters for use in liquid crystal displays.

A drive for ejecting liquid in a liquid-ejecting head, that is, a piezoelectric element used as pressure-generating means for altering the pressure of liquid in a flow passage in a liquid-ejecting head, includes a piezoelectric film between electrodes. For example, the piezoelectric film is formed of a crystallized piezoelectric ceramic, more specifically, lead zirconium titanate (PZT) (see, for example, JP-A-2006-306709). The characteristics of the piezoelectric element depend on the composition of PZT. For example, it is known that the deformation of the piezoelectric element during startup (initial deformation) can be increased with an increase in titanium (Ti)/zirconium (Zr) ratio.

However, it is also known that an excessively high Ti/Zr ratio results in a high deformation reduction rate that depends on the number of operations performed. In contrast, a lower Ti/Zr ratio results in a smaller initial deformation during startup but a lower deformation reduction rate. Thus, there is a trade-off between a large initial deformation and a low deformation reduction rate, and it is difficult to realize both a large initial deformation and a low deformation reduction rate to a high degree.

SUMMARY

An advantage of some aspects of the invention is that it provides a piezoelectric element that deforms as much as possible during startup and has a low deformation reduction rate that depends on the number of operations performed and a method for manufacturing the piezoelectric element, a liquid-ejecting head and a method for manufacturing the liquid-ejecting head, and a liquid-ejecting apparatus.

A piezoelectric element according to one aspect of the invention includes a piezoelectric film containing lead (Pb), zirconium (Zr), and titanium (Ti), wherein the piezoelectric film has a composition satisfying the relationship of $Zr/(Ti+Zr)>Ti/(Ti+Zr)$ and has a polarization-electric field hysteresis loop having a $Pm/2Pr$ of 1.95 or more and a $Vc(-)$ of $-1.75$ V or more, wherein Pm denotes saturation polarization, Pr denotes remanent polarization, and $Vc(-)$ denotes a negative coercive electric field intensity.

Another aspect of the invention is a method for manufacturing a piezoelectric element including a piezoelectric film containing lead (Pb), zirconium (Zr), and titanium (Ti). The method includes firing a piezoelectric precursor film having a composition satisfying the relationship of $Zr/(Ti+Zr)>Ti/(Ti+Zr)$ to form a piezoelectric film; and supplying the piezoelectric film with a nitrogen-containing gas, wherein the gas supply is controlled such that the piezoelectric film has a polarization-electric field hysteresis loop having a $Pm/2Pr$ of 1.95 or more and a $Vc(-)$ of $-1.75$ V or more, wherein Pm denotes saturation polarization, Pr denotes remanent polarization, and $Vc(-)$ denotes a negative coercive electric field intensity.

The term "piezoelectric precursor film", as used herein, refers to a film prepared by dissolving or dispersing an organometallic compound containing Pb, Zr, and Ti in solvent, spreading the resulting sol, and drying the sol layer for gelation.

The sentence "the gas supply is controlled", as used herein, means that the flow rate, the supply time, the flow direction, and/or another factor of gas is controlled.

Still another aspect of the invention is a liquid-ejecting head that includes a nozzle opening, a pressure-generating chamber in communication with the nozzle opening, and a piezoelectric element. The piezoelectric element is operated to eject liquid from the nozzle opening. The piezoelectric element includes a piezoelectric film containing lead (Pb), zirconium (Zr), and titanium (Ti). The piezoelectric film has a composition satisfying the relationship of $Zr/(Ti+Zr)>Ti/(Ti+Zr)$ and has a polarization-electric field hysteresis loop having a $Pm/2Pr$ of 1.95 or more and a $Vc(-)$ of $-1.75$ V or more, wherein Pm denotes saturation polarization, Pr denotes remanent polarization, and $Vc(-)$ denotes a negative coercive electric field intensity.

Still another aspect of the invention is a method for manufacturing a liquid-ejecting head that includes a nozzle opening, a pressure-generating chamber in communication with the nozzle opening, and a piezoelectric element. The piezoelectric element is operated to eject liquid from the nozzle opening. The method includes firing a piezoelectric precursor film having a composition satisfying the relationship of $Zr/(Ti+Zr)>Ti/(Ti+Zr)$ to form a piezoelectric film, and supplying the piezoelectric film with a nitrogen-containing gas, wherein the gas supply is controlled such that the piezoelectric film has a polarization-electric field hysteresis loop having a $Pm/2Pr$ of 1.95 or more and a $Vc(-)$ of $-1.75$ V or more, wherein Pm denotes saturation polarization, Pr denotes remanent polarization, and $Vc(-)$ denotes a negative coercive electric field intensity.

Still another aspect of the invention is a liquid-ejecting apparatus including a liquid-ejecting head. The liquid-ejecting head includes a nozzle opening, a pressure-generating chamber in communication with the nozzle opening, and a piezoelectric element. The piezoelectric element is operated to eject liquid from the nozzle opening. The piezoelectric element includes a piezoelectric film containing lead (Pb), zirconium (Zr), and titanium (Ti). The piezoelectric film has a composition satisfying the relationship of Zr/(Ti+Zr)>Ti/(Ti+Zr) and has a polarization-electric field hysteresis loop having a Pm/2Pr of 1.95 or more and a Vc(−) of −1.75 V or more, wherein Pm denotes saturation polarization, Pr denotes remanent polarization, and Vc(−) denotes a negative coercive electric field intensity.

According to an aspect of the invention, the piezoelectric film having a composition satisfying the relationship of Zr/(Ti+Zr)>Ti/(Ti+Zr) can exhibit a large deformation during startup (maximum deformation), and the polarization-electric field hysteresis loop having a Pm/2Pr of 1.95 or more and a Vc(−) of −1.75 V or more (wherein Pm denotes saturation polarization, Pr denotes remanent polarization, and Vc(−) denotes a negative coercive electric field intensity) allows the deformation reduction rate that depends on the number of operations performed to be reduced.

BRIEF DESCRIPTION OF THE DRAWINGS

The invention will be described with reference to the accompanying drawings, wherein like numbers reference like elements.

FIG. 7 is a table showing measurements of the hysteresis of a piezoelectric layer.

DESCRIPTION OF EXEMPLARY EMBODIMENTS

Embodiments of the invention will be described below with reference to the accompanying drawings. Although the following preferred embodiments of the invention include various limitations, unless otherwise specified, the scope of the invention is not limited to these embodiments. In the following embodiments, a liquid-ejecting apparatus according to an aspect of the invention is exemplified by an ink jet printer (hereinafter referred to simply as a printer) that includes an ink jet print head (hereinafter referred to simply as a print head), which is one type of liquid-ejecting heads.

First, a print head 1 will be described below.

Figure 1:
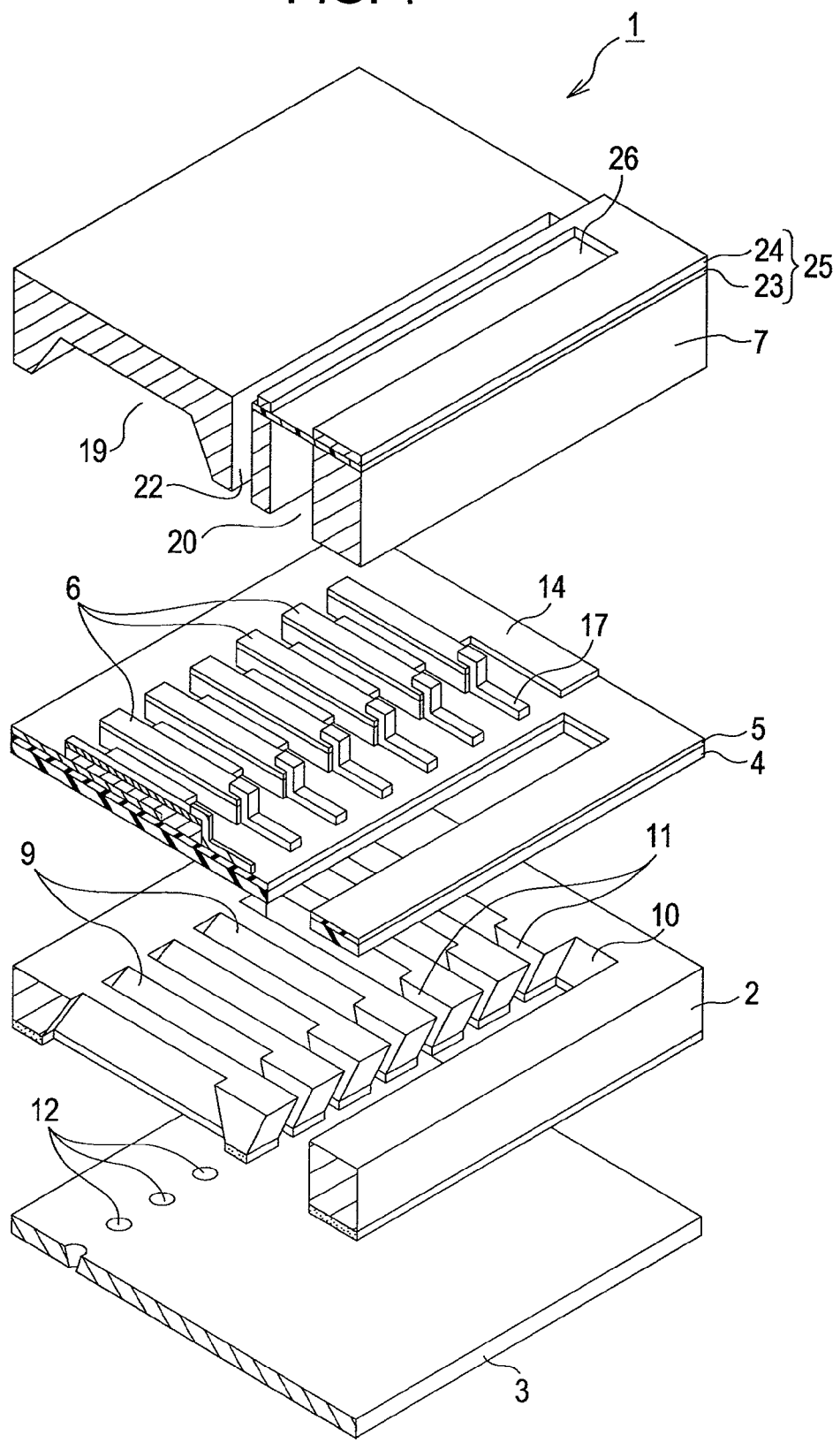
FIG. 1 is an exploded perspective view of a print head according to an embodiment of the invention.
Figure 2A:
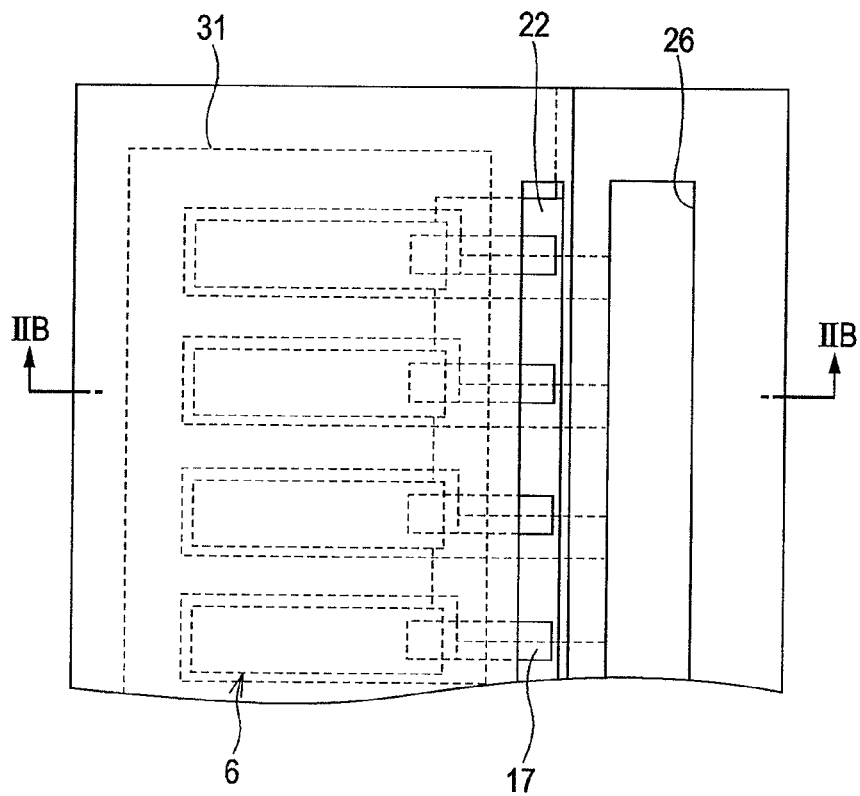
FIG. 2A is a fragmentary plan view of the print head illustrated in FIG. 1.
Figure 2B:
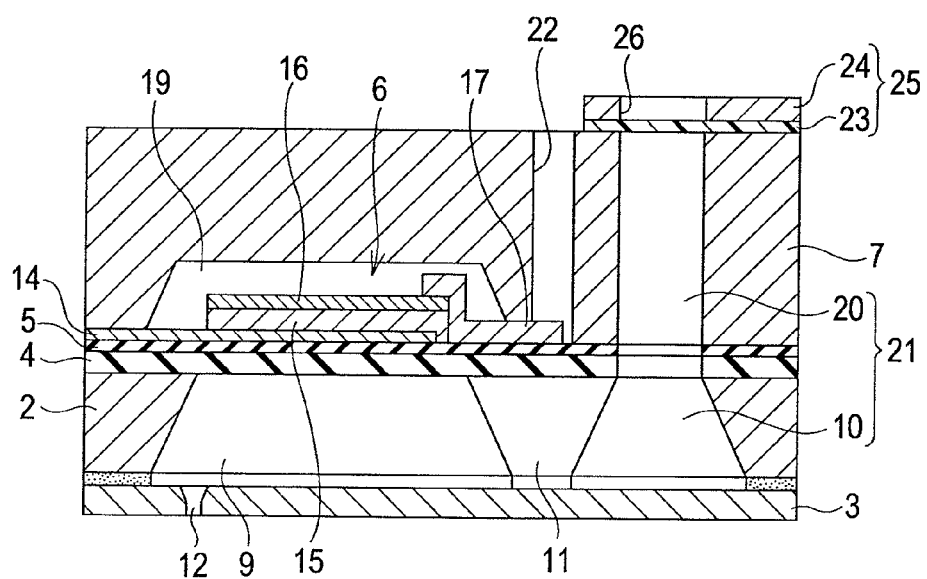
FIG. 2B is a cross-sectional view taken along the line IIB-IIB in FIG. 2A.

FIG. 1 is an exploded perspective view of a print head 1 according to the present embodiment. FIG. 2A is a fragmentary plan view of the print head 1, and FIG. 2B is a cross-sectional view taken along the line IIB-IIB in FIG. 2A. The print head 1 includes a flow-passage-forming substrate 2, a nozzle plate 3, an elastic film 4, an insulator film 5, a piezoelectric element 6, and a protective substrate 7.

The flow-passage-forming substrate 2 is a silicon single crystal substrate having a (110) plane orientation. The flow-passage-forming substrate 2 includes a plurality of pressure-generating chambers 9 juxtaposed to each other in the width direction. The flow-passage-forming substrate 2 further includes a communication portion 10 outside the pressure-generating chambers 9 in the longitudinal direction. The communication portion 10 is in communication with the pressure-generating chambers 9 through ink feed channels 11. The communication portion 10 is in communication with a reservoir portion 20 in the protective substrate 7 to constitute a reservoir 21, which is a common ink chamber of the pressure-generating chambers 9. The ink feed channels 11 have a smaller width than the pressure-generating chambers 9, producing a constant flow resistance against ink flowing from the communication portion 10 to the pressure-generating chambers 9.

The flow-passage-forming substrate 2 is attached to the nozzle plate 3, for example, with an adhesive or a heat seal film. The nozzle plate 3 includes nozzle openings 12 in communication with the pressure-generating chambers 9 opposite the ink feed channels 11. For example, the nozzle plate 3 is formed of a glass ceramic, silicon single crystal, or stainless steel having a thickness in the range of 0.01 to 1 mm and a linear expansion coefficient in the range of 2.5 to 4.5 ($\times 10^{-6}$/° C.) at 300° C. or less.

The flow-passage-forming substrate 2 is also attached to the elastic film 4. For example, the elastic film 4 is formed of silicon dioxide ($SiO_2$) and has a thickness of approximately 1.0 μm. The elastic film 4 is overlaid with the insulator film 5. For example, the insulator film 5 is formed of zirconium oxide ($ZrO_2$) and has a thickness of approximately 0.4 μm. The insulator film 5 is overlaid with a lower electrode film 14, for example, having a thickness of approximately 0.2 μm, a piezoelectric layer 15 (piezoelectric film 32), for example, having a thickness of approximately 1.0 μm, and an upper electrode film 16, for example, having a thickness of approximately 0.05 μm. The lower electrode film 14, the piezoelectric layer 15, and the upper electrode film 16 constitute the piezoelectric element 6. In general, one of the electrodes of the piezoelectric element 6 is a common electrode, and the other electrode and the piezoelectric layer 15 are patterned for each of the pressure-generating chambers 9. A portion that is composed of the patterned electrode and the piezoelectric layer 15 and causes a piezoelectric strain by the application of a voltage between the lower electrode film 14 and the upper electrode film 16 is referred to as a piezoelectric active portion. While the lower electrode film 14 is the common electrode of the piezoelectric element 6 and the upper electrode film 16 is the individual electrode of each piezoelectric element 6 in the present embodiment, for the convenience of a drive circuit or wiring, the lower electrode film 14 may be the individual electrode and the upper electrode film 16 may be the common electrode. In both cases, each of the pressure-generating chambers 9 has a piezoelectric active portion. The upper electrode film 16 of each of the piezoelectric elements 6 is connected to a lead electrode 17, for example, formed of gold (Au). A voltage is selectively applied to the piezoelectric elements 6 through the lead electrode 17.

The protective substrate 7 is disposed on top of the flow-passage-forming substrate 2 to cover the piezoelectric elements 6. The protective substrate 7 includes a piezoelectric element housing space 19 large enough for the deformation of the piezoelectric elements 6. The piezoelectric elements 6 in the piezoelectric element housing space 19 can be protected from the influence of the external environment. The protective substrate 7 includes the reservoir portion 20 in correspondence with the communication portion 10 in the flow-passage-forming substrate 2. The reservoir portion 20 is opened at the top of the protective substrate 7 and extends in the width direction. As described above, the reservoir portion 20 and the communication portion 10 in the flow-passage-forming substrate 2 constitute the reservoir 21, which serves as a common ink chamber for the pressure generating chambers 9.

A through-hole 22 passes through the protective substrate 7 in the thickness direction between the piezoelectric element housing space 19 and the reservoir portion 20. Part of the lower electrode film 14 and a tip of the lead electrode 17 are exposed in the through-hole 22. The lower electrode film 14 and the lead electrode 17 are connected to a connecting wire extending from a drive IC (not shown). The protective substrate 7 is overlaid with a compliance substrate 25, which includes a sealing film 23 and a fixing sheet 24. The sealing film 23 is formed of a flexible, low-rigidity material (for example, a poly(phenylene sulfide) film having a thickness of 6 μm) and seals one side of the reservoir portion 20. The fixing sheet 24 is formed of a hard material, such as metal (for example, a stainless steel sheet having a thickness of 30 μm). The fixing sheet 24 has an opening 26 on top of the reservoir 21. Thus, one side of the reservoir 21 is sealed with the flexible sealing film 23 alone.

The print head 1 can eject ink droplets by the following steps. First, the reservoir 21 to the nozzle openings 12 are filled with ink supplied from an external ink supply unit (not shown). A voltage is applied between the lower electrode film 14 and the upper electrode film 16 on the pressure-generating chamber 9 in accordance with a drive signal sent from a printer controller (not shown). The application of the voltage deforms the elastic film 4, the insulator film 5, the lower electrode film 14, and the piezoelectric layer 15, thereby increasing the internal pressure of the pressure-generating chamber 9. The ink is ejected from the nozzle openings 12 by controlling variations in the internal pressure.

A method for manufacturing such a print head 1 will be described below with reference to FIGS. 3 and 4. FIGS. 3 and 4 are longitudinal cross-sectional views of the pressure-generating chamber 9.

Figure 3A:
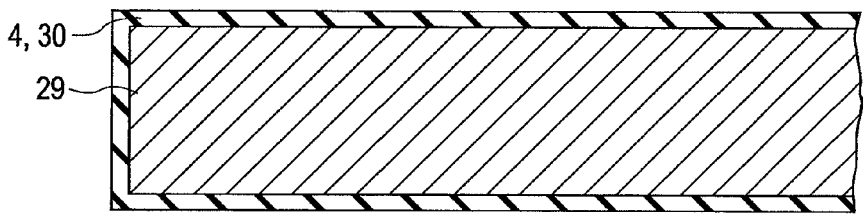
FIGS. 3A to 3D are cross-sectional views illustrating processes for manufacturing a print head according to an embodiment of the invention.
Figure 3B:
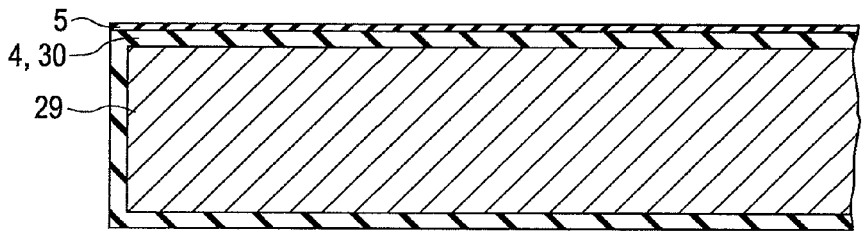
Figure 3C:
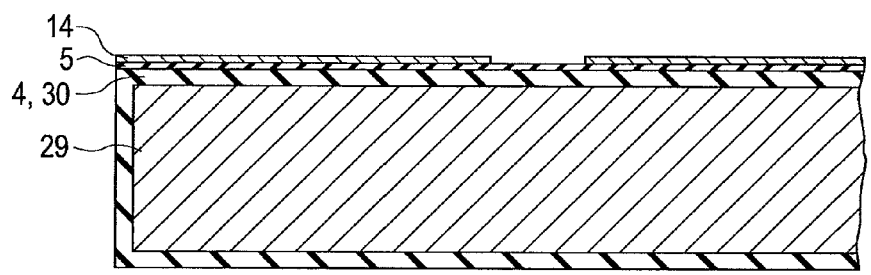

As illustrated in FIG. 3A, a flow-passage-forming substrate wafer 29 formed of silicon is thermally oxidized in a diffusion furnace at approximately 1100° C. to form a silicon dioxide film 30 serving as an elastic film 4. As illustrated in FIG. 3B, the elastic film 4 (silicon dioxide film 30) is overlaid with an insulator film 5 formed of zirconium oxide. More specifically, a zirconium layer is formed on the elastic film 4, for example, by DC sputtering and is thermally oxidized to form the insulator film 5 formed of zirconium oxide. As illustrated in FIG. 3C, for example, platinum (Pt) and iridium (Ir) are then deposited on the insulator film 5 to form a lower electrode film 14. The lower electrode film 14 is patterned in a predetermined shape.

Figure 3D:
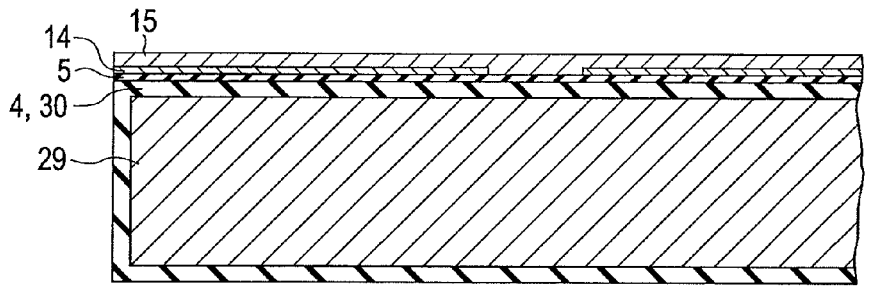

As illustrated in FIG. 3D, the lower electrode film 14 is overlaid with a piezoelectric layer 15, for example, formed of lead zirconium titanate (PZT). The piezoelectric layer 15 is formed by a sol-gel method. In the sol-gel method, a sol containing an organometallic compound dissolved or dispersed in solvent is applied to the lower electrode film 14, is dried for gelation, and is fired at a high temperature to form a piezoelectric film 32 (the piezoelectric layer 15) formed of metal oxide.

Figure 4A:
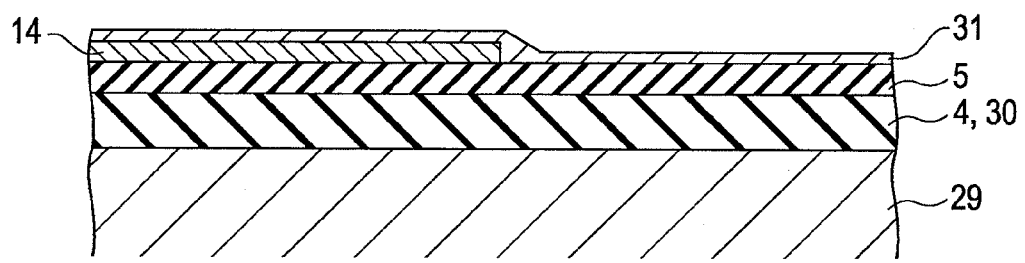
FIGS. 4A to 4C are cross-sectional views illustrating processes for manufacturing a print head according to an embodiment of the invention.

The piezoelectric layer 15 is formed as described below. First, as illustrated in FIG. 4A, the lower electrode film 14 is overlaid with a piezoelectric precursor film 31. More specifically, a sol (solution) containing an organometallic compound is applied to the lower electrode film 14 on the flow-passage-forming substrate 2 (a coating process). The sol is then heated from room temperature to a temperature lower than the boiling point of the main solvent of the sol and is dried for a predetermined period of time to form the piezoelectric precursor film 31 (a first drying process).

The main solvent of the sol is preferably, but not limited to, an ethanol solvent. In the present embodiment, the main solvent is 2-n-butoxyethanol having a boiling point of 176° C. In the first drying process, therefore, the sol is heated at a temperature below 176° C. (for example, approximately 140° C.) for approximately three minutes.

The piezoelectric precursor film 31 is further heated, for example, at a temperature higher than the temperature in the first drying process for a predetermined period of time to further evaporate the main solvent (a second drying process). The heating temperature in the second drying process ranges from 140° C. to 170° C. The drying time preferably ranges from approximately 5 to 50 minutes.

Examples of a heater used in the drying processes include clean ovens (diffusion furnaces) and baking apparatuses. In particular, baking apparatuses are preferred. In clean ovens, since the temperature is controlled with hot air, the characteristics of a piezoelectric precursor film tend to vary in the in-plane direction of a flow-passage-forming substrate wafer.

After the piezoelectric precursor film 31 is dried in the first and second drying processes, the piezoelectric precursor film 31 is degreased in the atmosphere at a predetermined temperature for a predetermined period of time (a degreasing process). The term "degreasing", as used herein, means that organic components of a sol layer are removed, for example, as $NO_2$, $CO_2$, and/or $H_2O$.

In the degreasing process, the piezoelectric precursor film 31 may be heated by any method. In the present embodiment, the flow-passage-forming substrate wafer 29 is placed on a hot plate to heat the piezoelectric precursor film 31 to a predetermined temperature. In the case of decreasing the heating rate, the flow-passage-forming substrate wafer 29 can be heated indirectly through an aluminum sheet having a predetermined thickness and a diameter slightly larger than the diameter of the wafer 29. The temperature in the degreasing process ranges from 350° C. to 450° C. An excessively high temperature results in the initiation of crystallization. An excessively low temperature results in large variations in Zr/Ti ratio. Preferably, the degreasing process is performed for 10 minutes or more.

The heating rate in the degreasing process is important in improving the crystallinity of the piezoelectric film. The heating rate in the degreasing process is set at 15° C./s or more. This can improve the (100) orientation intensity of the piezoelectric film and decrease variations in the ratio of components other than lead, for example, the Zr/Ti ratio.

The term "heating rate", as used herein, refers to the heating rate from 20% to 80% of the temperature difference between the starting temperature (room temperature) and the final temperature. When the temperature is increased from 25° C. to 100° C. in 50 seconds, the heating rate is (100−25)× (0.8−0.2)/50=0.9 (° C./s).

Figure 4B:
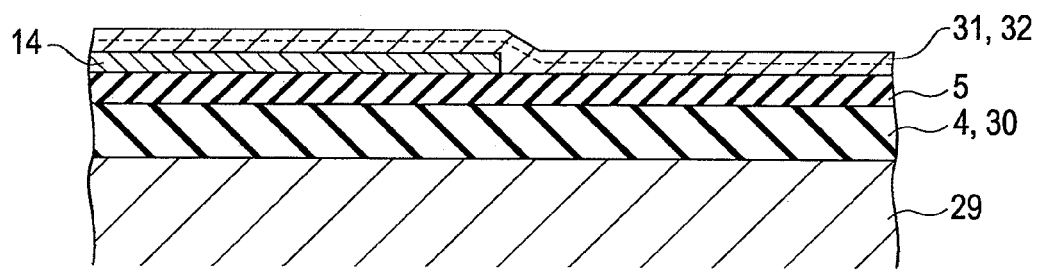

The coating process, the first drying process, the second drying process, and the degreasing process are performed predetermined times (twice in the present embodiment) to form the piezoelectric precursor film 31 having a predetermined thickness, as illustrated in FIG. 4B. These processes may be performed once or three times or more.

The piezoelectric precursor film 31 is heat-treated for crystallization to form the piezoelectric layer 15 (a firing process). The sintering conditions depend on the material to be sintered. In the present embodiment, the piezoelectric precursor film 31 is fired at approximately 700° C. for several to several tens of minutes to form the piezoelectric film 32. A rapid thermal annealing (RTA) apparatus is used as a heater. The firing process involves rapid heating at a heating rate in the range of 100 to 150 (° C./s). Such rapid heating can decrease foreign substances in the piezoelectric film 32.

After the piezoelectric precursor film 31 is crystallized to form the piezoelectric film 32 in the firing process, a cooling process (corresponding to supplying the piezoelectric film with a nitrogen-containing gas) is performed. In the cooling process, a nitrogen ($N_2$)-containing gas (a coolant gas) is blown against the piezoelectric film 32 to cool the piezoelectric film 32. In the cooling process, for example, a coolant gas at room temperature flows in the direction parallel to the surface of the wafer 29 for a few minutes to cool the piezoelectric film 32 from approximately 700° C. to approximately 400° C. The reason for selecting a nitrogen-containing gas as a coolant gas in the cooling process is that the characteristics of the piezoelectric film 32 can be controlled by the action of the nitrogen-containing gas. This will be described in detail below.

Figure 4C:
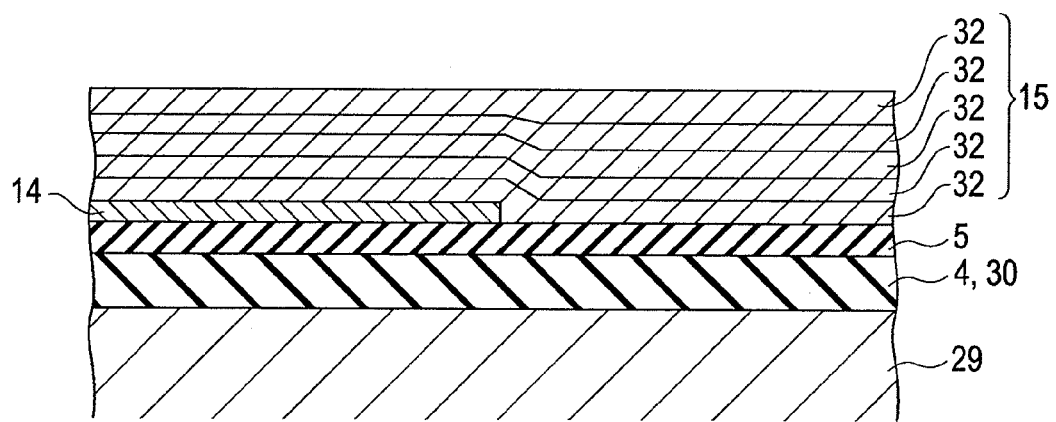

As illustrated in FIG. 4C, the coating process, the first and second drying processes, the degreasing process, the firing process, and the cooling process are performed twice or more to form the piezoelectric layer 15 having a predetermined thickness and composed of a plurality of (five in the present embodiment) piezoelectric films 32. When the thickness per application of the sol is approximately 0.1 μm, the piezoelectric layer 15 has a thickness of approximately 1 μm.

The composition of the piezoelectric layer 15, that is, the composition of the sol in the coating process will be described below. It is important to determine the optimum composition of the sol in consideration of the deformation (initial deformation) and the durability (the deformation reduction rate that depends on the number of operations performed) of the piezoelectric layer 15 (piezoelectric element 6). In particular, the Zr/Ti ratio is closely related to the deformation and the deformation reduction rate. A decrease in Zr/Ti ratio results in an increase in deformation during startup (maximum deformation) but an increase in deformation reduction rate. An increase in Zr/Ti ratio results in a decrease in deformation during startup but a decrease in deformation reduction rate.

In the present embodiment, the sol has a Pb/Zr/Ti ratio of 1.18/0.516/0.484. This satisfies the relationship of Zr/(Ti+Zr)>Ti/(Ti+Zr). In the cooling process, a nitrogen-containing gas is used as a coolant gas to realize both a large deformation and high durability of the piezoelectric layer 15, and the characteristics of the piezoelectric film 32 is controlled by the action of the nitrogen-containing gas. This will be described below.

Figure 5:
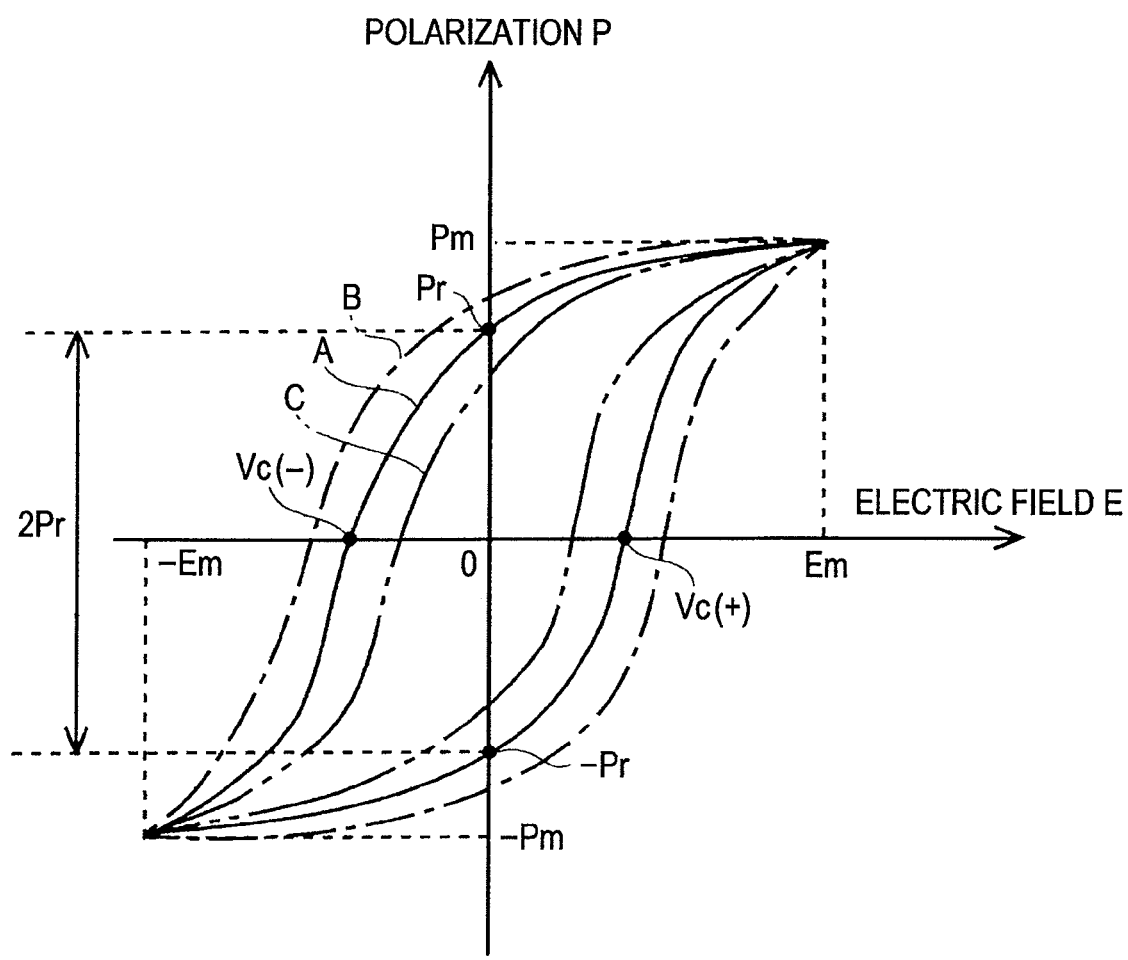
FIG. 5 is a graph showing polarization-electric field hysteresis loops of a piezoelectric layer.

FIG. 5 is a graph showing polarization-electric field hysteresis loops of a piezoelectric layer 15 (piezoelectric films 32). The hysteresis loops were measured with ±20 V triangular waves at a frequency of 66 Hz. The horizontal axis represents electric field intensity (E), and the vertical axis represents polarization (P). FIG. 5 shows that the piezoelectric layer 15 exhibits hysteresis in which the polarization is reversed at two coercive electric field intensities (a positive coercive electric field intensity Vc(+) and a negative electrode coercive electric field intensity Vc(−)). Pm denotes a saturation polarization point, and Pr denotes remanent polarization. The distance between the positive remanent polarization Pr and the negative remanent polarization —Pr is 2Pr. The hysteresis loop changes with the Zr/Ti ratio. A decrease in Zr/Ti ratio results in an increase in the distance between the positive coercive electric field intensity Vc(+) and the negative electrode coercive electric field intensity Vc(−), as indicated by the alternate long and short dashed line B, and an increase in the distance 2Pr between the positive remanent polarization Pr and the negative remanent polarization —Pr. In contrast, an increase in Zr/Ti ratio results in a decrease in the distance between the positive coercive electric field intensity Vc(+) and the negative electrode coercive electric field intensity Vc(−), as indicated by the chain double-dashed line C, and a decrease in the distance 2Pr.

The hysteresis of the piezoelectric layer 15 (piezoelectric films 32) can be controlled by the supply of a coolant gas in the cooling process. With regard to this point, the hysteresis of the piezoelectric layer 15 was measured using $N_2$ gas and $O_2$ gas as coolant gases in the cooling process. To clarify the effects of the coolant gas, the coolant gas was disproportionately blown against the piezoelectric film 32 on the flow-passage-forming substrate wafer 29. Less cooling gas was blown against the orientation flat (OF) side than against the side opposite the orientation flat (the side opposite OF) of the piezoelectric film 32 on the wafer.

Figure 6A:
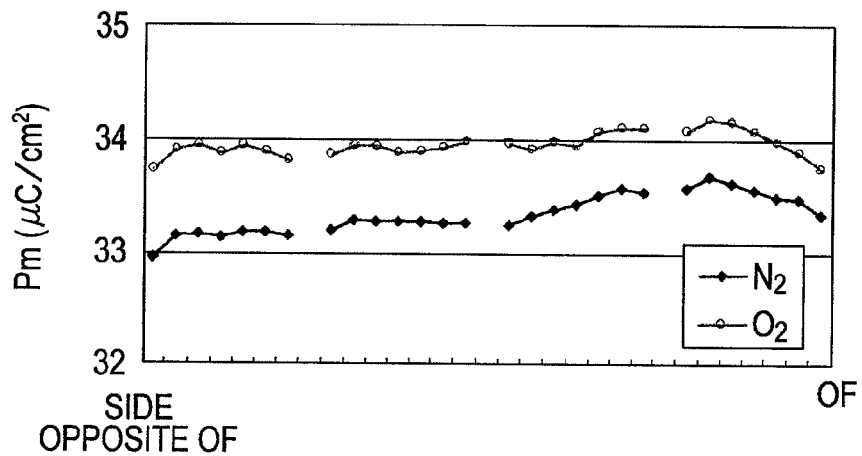
FIGS. 6A to 6C are graphs showing measurements of the hysteresis of a piezoelectric layer.
Figure 6B:
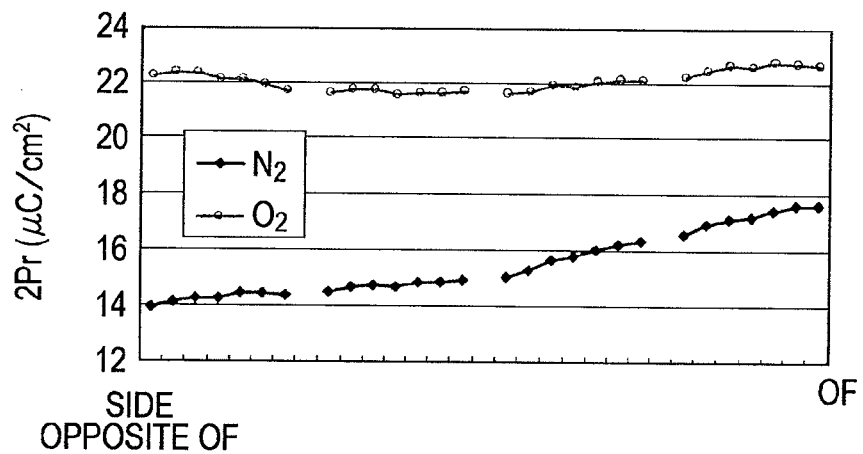
Figure 6C:
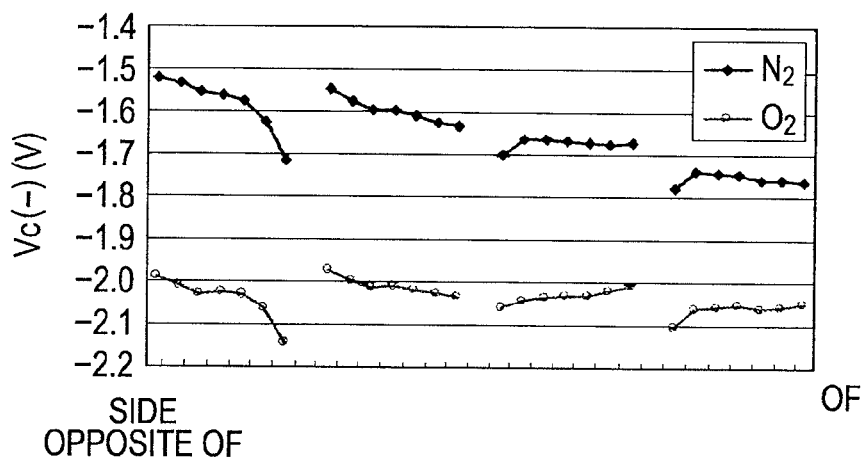

FIG. 6A shows the positive saturation polarization point Pm, FIG. 6B shows the distance 2Pr between the positive and negative remanent polarizations Pr, and FIG. 6C shows the distribution of the negative electrode coercive electric field intensity Vc(−) on the wafer. FIG. 7 is a table showing Pm, 2Pr, Vc(−), Pm/2Pr, and the deformation reduction rate of the piezoelectric layer for $N_2$ gas (the OF side and the side opposite OF) and $O_2$ gas. For the $N_2$ coolant gas, 2Pr and Vc(−) were different on the OF side and the side opposite OF. 2Pr was smaller on the side opposite OF, against which more $N_2$ gas was blown, than on the OF side. Vc(−) on the side opposite OF shifted positively from Vc(−) on the OF side. The deformation reduction rate on the side opposite OF was decreased below 10%, that is, 8% to 9%. The deformation reduction rate on the OF side ranged from 11% to 13%.

For the $O_2$ coolant gas, 2Pr and Vc(−) were less different on the OF side and the side opposite OF. Over the entire wafer, 2Pr was larger for $O_2$ gas than for $N_2$ gas, and Vc(−) for $O_2$ gas shifted negatively from Vc(−) for $N_2$ gas. The deformation reduction rate for $O_2$ gas ranged from 14% to 16%. For the case in which the wafer was left to stand after the firing process without using a coolant gas, the results were the same as the results for $O_2$ gas. The saturation polarization point Pm was substantially the same on the OF side and the side opposite OF.

These results show that blowing $N_2$ gas in the cooling process changed the hysteresis of the piezoelectric layer 15. This is probably because $N_2$ reduced the surface of the piezoelectric layer 15 (piezoelectric films 32). These results also show that use of $N_2$ gas in the cooling process can minimize the deformation reduction rate.

At a Zr/Ti ratio lower than a known Zr/Ti ratio, 2Pr increases, and Vc(−) shifts negatively. Use of $O_2$ gas as a coolant gas has the same effects as a decrease in Zr/Ti ratio. A decrease in Zr/Ti ratio results in an increase in deformation reduction rate. Use of $N_2$ gas as a coolant gas has the same effects as an increase in Zr/Ti ratio. The reduction in deformation can therefore be smaller for $N_2$ gas than for $O_2$ gas even at a known Zr/Ti ratio (0.516/0.484, a high Zr content).

Thus, in the present embodiment, $N_2$ gas is used as a coolant gas in the cooling process, and through the action of $N_2$ gas, the gas supply is controlled such that the piezoelectric layer 15 (piezoelectric films 32) has a polarization-electric field hysteresis loop having a Pm/2Pr of 1.95 or more and a Vc(−) of −1.75 V or more, wherein Pm denotes saturation polarization, Pr denotes remanent polarization, and Vc(−)

denotes a negative coercive electric field intensity. The gas supply may be controlled in terms of flow rate, supply time, and/or flow direction.

The piezoelectric film 32 (piezoelectric layer 15) of the piezoelectric element 6 fabricated through these processes has a composition satisfying the relationship of Zr/(Ti+Zr)>Ti/(Ti+Zr) and has a polarization-electric field hysteresis loop having a Pm/2Pr of 1.95 or more and a Vc(−) of −1.75 V or more, wherein Pm denotes saturation polarization, Pr denotes remanent polarization, and Vc(−) denotes a negative coercive electric field intensity. Thus, the piezoelectric element 6 can exhibit a large deformation during startup (initial deformation) and has a low deformation reduction rate that depends on the number of operations performed.

A printer that includes a print head 1 including the piezoelectric element 6 as pressure-generating means will be described below.

Figure 8:
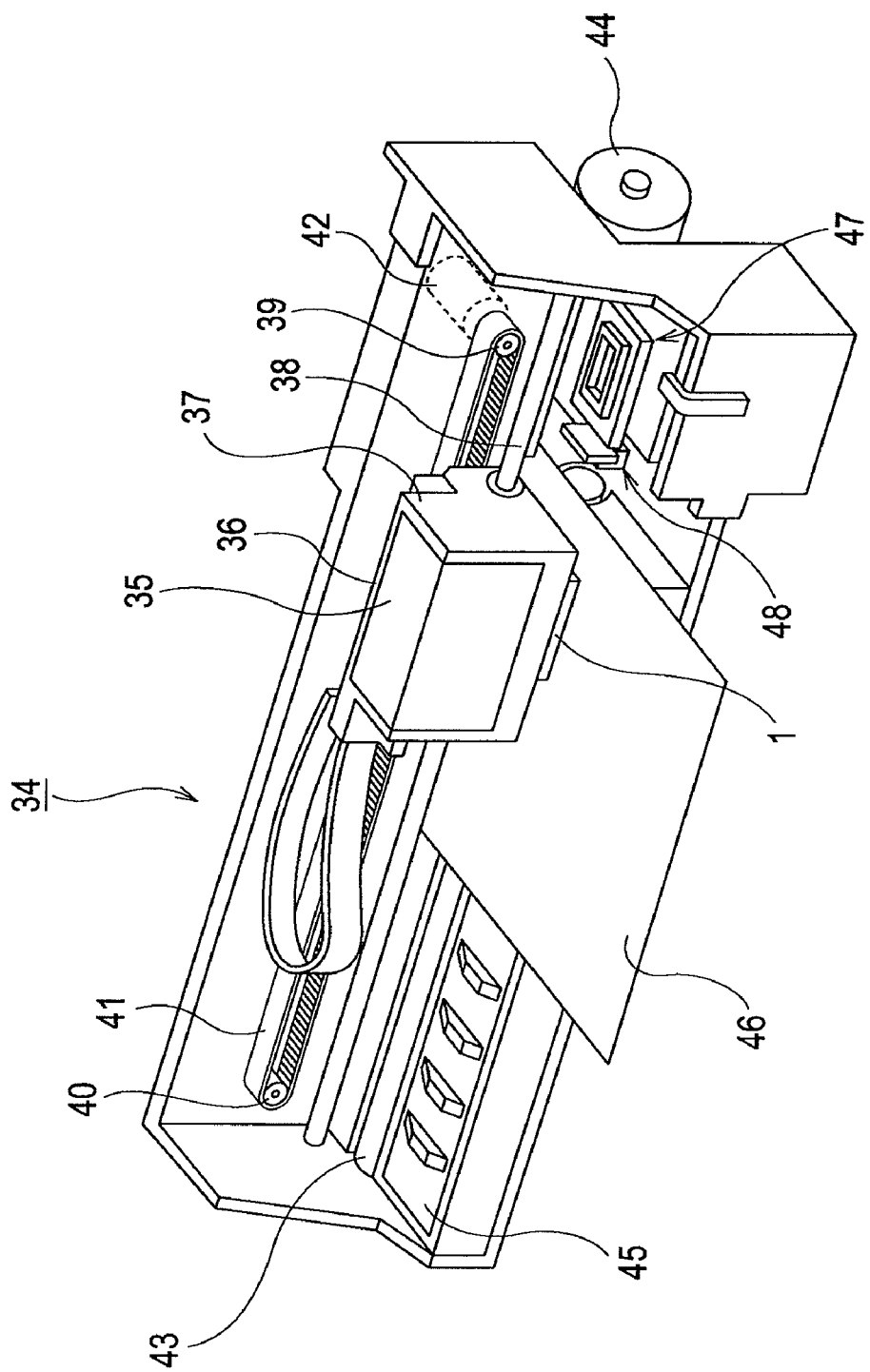
FIG. 8 is a perspective view of a printer.

FIG. 8 is a perspective view of a printer 34 according to the present embodiment. The printer 34 includes a cartridge holder 36 for holding an ink cartridge 35 and a carriage 37 on which the print head 1 is installed. The carriage 37 is supported on a guide rod 38 and is connected to a timing belt 41 stretched between a drive pulley 39 and a free-rotating pulley 40. The drive pulley 39 is joined to a rotating shaft of a stepping motor 42. The stepping motor 42 drives the carriage 37 in the width direction of recording paper 46 (one type of recording media and ejection targets), that is, in the main scanning direction.

A paper feed roller 43 is disposed under and parallel to the guide rod 38. The paper feed roller 43 is rotated by the driving force of a paper feed motor 44 to transport the recording paper 46 on a platen 45 in the sub-scanning direction.

A home position is disposed as the starting point of the print head 1 in the moving range of the carriage 37 and in a marginal area outside a printing area of an ejection target, such as recording paper. A capping mechanism 47 for capping (sealing) a nozzle face of the print head 1 and a wiping mechanism 48 for wiping the nozzle face are juxtaposed to each other on the home position side.

In such a printer 34, the ink cartridge 35 mounted in the cartridge holder 36 of the carriage 37 supplies the print head 1 with ink. Upon the operation of the piezoelectric element 6, the print head 1 ejects ink onto the recording paper 46 to form dots while the carriage 37 moves in the main scanning direction. The print head 1 ejects ink in the main scanning while the recording paper 46 is transported in the sub-scanning direction, thus forming images and letters on the recording paper 46.

Such a printer 34 that includes a piezoelectric element 6 according to an aspect of the invention as pressure-generating means can have a low deformation reduction rate of the piezoelectric element 6 that depends on the number of operations performed, thus achieving high reliability.

The invention is not limited to the embodiments described above. Although the invention has been described in the embodiments with an ink jet print head, the invention can be applied to ejection of liquid other than ink. Examples of the liquid-ejecting heads include recording heads for use in image recorders, such as printers, coloring material ejecting heads for use in the manufacture of color filters for liquid crystal displays, electrode material ejecting heads for use in the formation of electrodes for organic EL displays and field emission displays (FED), and bioorganic compound ejecting heads for use in the manufacture of biochips. The invention can be suitably applied to liquid-ejecting apparatuses including such liquid-ejecting heads.

What is claimed is:

1. A piezoelectric element comprising a piezoelectric film containing lead (Pb), zirconium (Zr), and titanium (Ti), wherein the piezoelectric film has a composition satisfying the relationship of Zr/(Ti+Zr)>Ti/(Ti+Zr) and has a polarization-electric field hysteresis loop having a Pm/2Pr of 1.95 or more and a Vc(−) of −1.75 V or more, wherein Pm denotes saturation polarization, Pr denotes remanent polarization, and Vc(−) denotes a negative coercive electric field intensity.

2. A method for manufacturing a piezoelectric element including a piezoelectric film containing lead (Pb), zirconium (Zr), and titanium (Ti), the method comprising:
firing a piezoelectric precursor film having a composition satisfying the relationship of Zr/(Ti+Zr)>Ti/(Ti+Zr) to form a piezoelectric film; and
supplying the piezoelectric film with a nitrogen-containing gas,
wherein the gas supply is controlled such that the piezoelectric film has a polarization-electric field hysteresis loop having a Pm/2Pr of 1.95 or more and a Vc(−) of −1.75 V or more, wherein Pm denotes saturation polarization, Pr denotes remanent polarization, and Vc(−) denotes a negative coercive electric field intensity.

3. A liquid-ejecting head comprising: a nozzle opening; a pressure-generating chamber in communication with the nozzle opening; and a piezoelectric element, the piezoelectric element being operated to eject liquid from the nozzle opening,
wherein the piezoelectric element includes a piezoelectric film containing lead (Pb), zirconium (Zr), and titanium (Ti), and
the piezoelectric film has a composition satisfying the relationship of Zr/(Ti+Zr)>Ti/(Ti+Zr) and has a polarization-electric field hysteresis loop having a Pm/2Pr of 1.95 or more and a Vc(−) of −1.75 V or more, wherein Pm denotes saturation polarization, Pr denotes remanent polarization, and Vc(−) denotes a negative coercive electric field intensity.

4. A method for manufacturing a liquid-ejecting head that includes a nozzle opening, a pressure-generating chamber in communication with the nozzle opening, and a piezoelectric element, the piezoelectric element being operated to eject liquid from the nozzle opening, comprising:
firing a piezoelectric precursor film having a composition satisfying the relationship of Zr/(Ti+Zr)>Ti/(Ti+Zr) to form a piezoelectric film; and
supplying the piezoelectric film with a nitrogen-containing gas,
wherein the gas supply is controlled such that the piezoelectric film has a polarization-electric field hysteresis loop having a Pm/2Pr of 1.95 or more and a Vc(−) of −1.75 V or more, wherein Pm denotes saturation polarization, Pr denotes remanent polarization, and Vc(−) denotes a negative coercive electric field intensity.

5. A liquid-ejecting apparatus comprising a liquid-ejecting head, the liquid-ejecting head including a nozzle opening, a pressure-generating chamber in communication with the nozzle opening, and a piezoelectric element, the piezoelectric element being operated to eject liquid from the nozzle opening,
wherein the piezoelectric element includes a piezoelectric film containing lead (Pb), zirconium (Zr), and titanium (Ti), and
the piezoelectric film has a composition satisfying the relationship of Zr/(Ti+Zr)>Ti/(Ti+Zr) and has a polarization-electric field hysteresis loop having a Pm/2Pr of 1.95 or more and a Vc(−) of −1.75 V or more, wherein Pm denotes saturation polarization, Pr denotes remanent polarization, and Vc(−) denotes a negative coercive electric field intensity.

* * * * *